United States Patent [19]

Goronkin et al.

[11] 3,737,743

[45] June 5, 1973

[54] HIGH POWER MICROWAVE FIELD EFFECT TRANSISTOR

[75] Inventors: Herbert Goronkin, Syracuse; John W. Lunden, Camillus, both of N.Y.

[73] Assignee: General Electric Company, Syracuse, N.Y.

[22] Filed: Dec. 23, 1971

[21] Appl. No.: 211,503

[52] U.S. Cl........317/235 R, 317/235 B, 317/235 UA

[51] Int. Cl...............................................H01l 5/00

[58] Field of Search......................................317/234

[56] References Cited

UNITED STATES PATENTS

| | | | |
|---|---|---|---|
| 3,414,781 | 12/1968 | Dill | 317/235 |
| 3,449,648 | 6/1969 | Beale et al. | 317/235 |
| 3,303,067 | 2/1967 | Haering et al. | 148/174 |

*Primary Examiner*—John W. Huckert
*Assistant Examiner*—E. Wojciechowicz
*Attorney*—Richard V. Lang and Carl W. Baker

[57] ABSTRACT

The present invention relates to field transistors having source and drain electrodes in ohmic contact with a semiconductor body, and having an intervening gate electrode of the Schottky barrier type. The present device is designed for high power and high frequency applications. These capabilities are achieved by use of a meandering channel of appreciable width, to which an efficient path for power transmission is provided at both low and high frequencies. The path entails the use of an additional conductive layer superimposed over the source and drain metallizations and not only providing a low resistance d.c. path to the gate, but also forming an efficient low phase dispersion transmission line into the active region of the device.

17 Claims, 8 Drawing Figures

HIGH POWER MICROWAVE FIELD EFFECT TRANSISTOR

BACKGROUND OF THE INVENTION

1. Field of the Invention

The invention relates to semiconductor devices of the field effect transistor type and to those adapted for higher power and high frequency use by use of a meandering gate. The invention also relates to active high frequency devices having electrode structures designed for efficient integration into transmission line configurations.

2. Description of the Prior Art

Transistors of the field effect variety are well known and their high frequency potentialities generally recognized if not realized in practice. For high signal levels a known approach has been the use of a configuration in which the source and drain electrodes form interdigital figures with a meandering gate electrode threading its way between the opposing source and drain digits. Such a construction is described on pages 176 and 177 of the book entitled "Semiconductors and Semimetals", Vol. 7, Applications and Devices, edited by Willardson and Beer and published by the Academic Press, 1971.

The field effect transistor is in principle a very high frequency device whose intrinsic frequency limits are primarily determined by the length of the channel region between source and drain. When one seeks to attain the same frequency limits in wider meandering channels to achieve greater power capability, the high frequency capability falls.

The problem in achieving high power or both high power and high frequency capabilities in meandering gate devices, is that the use of a gate contact at one extremity of the meandering gate is inefficient. The growing IR drop as one proceeds further away from the gate contact, reduces the gate excitation, while at the same time a rapidly increasing loss of phase coherence exists between the near and far portions of the gate. These effects tend to set upper practical limits on the length of a meandering gate, and thereby the practical frequency and power limits for a single device. Present limits appear to be unnecessarily low when one considers the corresponding theoretical limits.

Speaking more generally, semiconductor devices as a class have generally been small in terms of operating wavelengths and high frequency capabilities have evolved quite slowly. Thus, the need for efficient transmission structures coupling into the active region has only gradually become more important. The present invention seeks to solve both the problems of efficient internal coupling at high powers and high frequencies and efficient external coupling.

SUMMARY OF THE INVENTION

It is a principal object of the invention to provide an improved field effect transistor of the meandering gate variety.

It is another object of the invention to provide an improved field effect transistor of the meandering gate variety having improved power capability.

It is another object of the invention to provide an improved field effect transistor of the meandering gate variety having improved high frequency capabilities.

It is a further object of the invention to provide an improved field effect transistor having improved internal coupling to the active region of the device.

It is another object of the invention to provide an improved field effect transistor having improved external coupling.

These and other objects are achieved in one practical embodiment of the invention in a field effect transistor having an active semiconductor region upon which source and drain electrodes are disposed, whose facing boundaries define a channel in the active region. The active region is preferably epitaxial. The channel is normally of a meandering configuration. An insulating layer is arranged over the source and drain electrodes having a groove along the channel region. Conductive means coat the insulating layer and contact the channel in spaced relationship with the boundaries of the source and drain electrodes. The conductive means reduces the differences in electrical path length between different points along the gate to less than twice their actual distance apart and thus reduces the phase dispersion of the device from that of a serially excited gate. The construction also facilitates very substantial electroding to the gate region which in most applications produces a negligible IR drop to any point along the gate.

In accordance with another aspect of the invention, the source and drain electrodes are provided with metallizations which extend outwardly from the active semiconductor region and form efficient transmission lines, optionally with the gate metallization, matching the input requirements of the active region to conventional external transmission lines.

In order to achieve uniform power distribution, the gate region is meandered by a series of interdigital elements having symmetrically tapered sides which are oriented with their bases in line with the constant phase wave front of the excitation. In this configuration, the phase dispersion within the device is brought to an extremely small minimum, and practical upper frequency limits of this device approach more closely than before the intrinsic limits set by the length of the channel region. The tapering configuration permits the metallizations of each digit to establish a substantially uniform current distribution along the peripheral channel region by suitably adjusting the characteristic transmission line impedance in each digit. The characteristic impedance of the transmission line in each digit thus is made to increase as one proceeds into the digit in correspondence with the desired diminution of current as the tip of the digit is approached.

In accordance with another aspect of the invention, the step into the epitaxial region from the surrounding substrate which is essential for electrical isolation is made minimal by the use of an inert gas etching process which provides very precise control of etching depths. The insulating layer, which is used to support the gate metallization, is formed of silane deposited $SiO_x$, the layer being stress relieved by a thin layer of $SiO_2$ applied between it and the epitaxial region.

BRIEF DESCRIPTION OF THE DRAWING

The novel and distinctive features of the invention are set forth in the claims appended to the present application. The invention itself, however, together with the further objects and advantages thereof may be best understood by reference to the following description and accompanying drawings in which:

DESCRIPTION OF THE PREFERRED EMBODIMENT

Figures 1, 2:
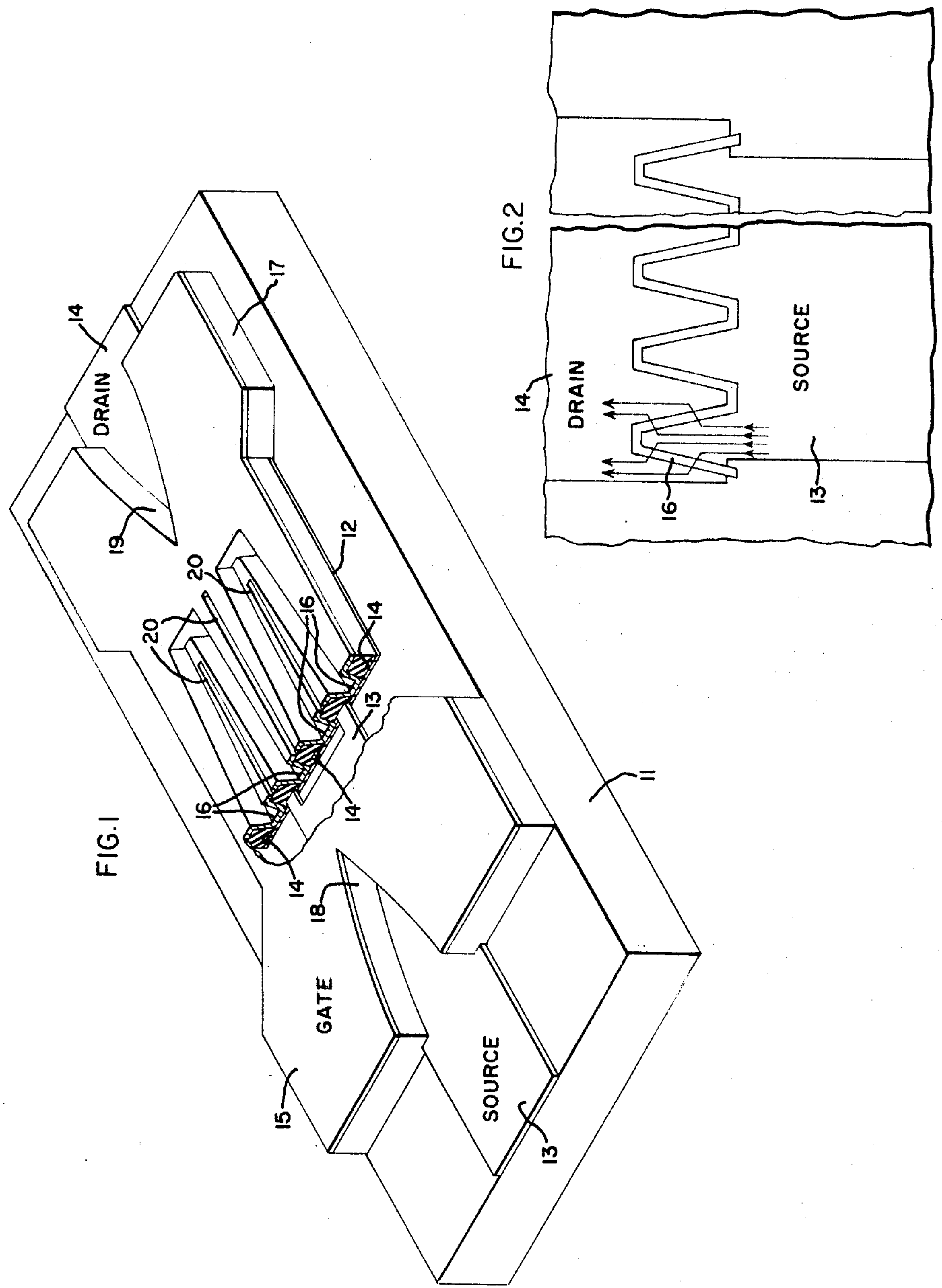
FIG. 1 is a perspective illustration of a high frequency, medium power field effect transistor together with its interconnecting transmission elements.
FIG. 2 is a plan view of the source and drain metallizations of an interdigital field effect transistor of medium to high power.

Referring now to FIG. 1, a simplified perspective view of an improved field effect transistor embodying the present invention is shown. The device and its electrical connections are arranged for support upon an insulating substrate 11. The substrate provides a surface suitable for formation of an epitaxial layer 12 used for the active channel region of the FET. The FET is provided with three electrode metallizations 13, 14 and 15, extending into the channel region and serving the joint purposes of interacting with the channel region as conventional electrodes and at the same time providing efficient transmission line elements for external coupling.

The metallizations 13 and 14 make ohmic contact with the upper surface of the epitaxial layer and form the source electrode (13) and drain electrode (14) of the FET, respectively. While not fully visible in the view of FIG. 1, these metallizations are interdigitally arranged as shown in the plan view of FIG. 2 to form a meandering channel 16 region. As FIG. 2 implies, a practical embodiment will normally have a plurality of digits, the number being dependent upon the application. The two metallizations 13 and 14 are in the same plane in consequence of their deposition upon the epitaxial layer 12, and the interdigital elements are spaced a constant distance along their lateral edges. In accordance with conventional usage, the most direct path across the gap between the metallizations 13 and 14 is measured in the same direction as the "length" of the channel, and the "width" of the channel is the accumulated linear dimension measured transverse to the "length" from start to finish of the meandering channel 16. As will be explained in greater detail below, the individual digits of the metallizations 13, 14 and 15 are tapered to provide substantially even current distribution into each elemental 3 width" of channel, the current distribution, however, falling off to near 0 at the tips of each digit.

The gate metallization 15 is supported upon a thick insulating layer 17 of $SiO_x$, the subscript denoting a non-stoichiometric oxidation of silicon. The oxide layer 17 is several microns in thickness and is deeply grooved in a narrow region which follows along and exposes the meandering channel 16 for electrical contact. In fabrication, a high resolution metallization 37 (FIG. 3F) is initially formed on the surface of the epitaxial layer to form a Schottky barrier electrode. It is spaced from adjacent source and drain metallizations 13 and 14 a nd continues along the "width" of the channel. Subsequently, a second metallization 38 (FIG. 3F) is formed over the oxide layer 17. This metallization 38 (FIG. 3F) coats the lateral surfaces of the grooves formed in the oxide and makes contact with the high resolution gate metallization 37, as shown in the more detailed illustration of the gate construction provided in FIG. 3F. The initial gate metallization 37 is of molybdenum, applied to form a Schottky type barrier on the surface of the epitaxial layer 12. Aluminum may also be used for 37.

As seen in FIGS. 1 and 2, the metallizations 13, 14 and 15 extend away from the active regions on the channel to form input and output transmission lines. The foregoing configuration is designed for operation with the gate "common". Alternatively, with a grounded source 13, one may employ the drain electrode together with a ground plane as the output transmission elements. The characteristic input impedance level, assuming that the layer 17 is of several microns, can be readily controlled to reasonable values, typically between 10 and 200 ohms. If lower impedances are desired for higher power applications, these may be achieved by proper combination of groups of the above types. Control of the characteristic impedance is achieved by control of the distributed capacity and more particularly by cutouts and shaping of the opposing conductive layers. In the FIG. 1 embodiment, this is achieved at the outer portions of the transmission elements by splitting (offsetting) the elements of the gate connected metallization 15 near the edges of the substrate and spacing them away from the source and drain metallizations as shown at 18 and 19.

As one proceeds into each digit, however, the gate metallization 15 may be slotted as shown at 20 to provide the correct absolute impedance level in addition to its desired variation along the channel bounding that digit.

A second advantage of the illustrated disposition of the conductors is that the transmission path which they form facilitates application of a properly phased wave front to the active channel region at much higher operating frequencies than before. The objective is to keep all parts of the channel at the proper phase. In the case of an interdigital configuration, like the embodiment illustrated in FIG. 1, the wave front should reach the base of each digital element in the same phase. At low frequencies, the tiny overall dimensions of the field effect transistors are small fractions of an electrical wavelength, and balanced drive provides a degree of phase precision which is normally unnecessary. Thus, one may couple the input signal to only one input side of the gate metallization. The signal is then allowed to equalize itself by travelling laterally across the metallization since that distance (at lower frequencies) is too short to significantly affect the phase.

Thus, by use of a gate metallization in a plane positioned over the source and drain metallizations, the need for signal currents to follow the long meandering serial course of the gate electrode is avoided. Asymmetric connection to one side of the gate does not disturb the phase relations in the present device until considerably higher frequencies than for a comparable serially excited gate device. Of course, for more nearly optimum phase relations, the input signal should be applied to both sides of the gate electrodes which are conveniently available in applicants' arrangement. At higher frequencies one may apply a constant phase wave front to the base of each digital element to achieve operation at even higher frequencies.

At lower frequencies the present arrangement still has an advantage over the conventional serial arrangement. The long serial current path along the width of the gate in conventional devices may not be long enough to create an objectionable inequality in phase, but may disrupt optimum power distribution into the gate due to accumulating IR losses. In the conventional serially excited gate, the IR drops in the very fine filament-like metallization accumulate as one proceeds further away from the gate input pad and continuously reduces the gate drive. In contrast, the upper gate metallization 38 of the present construction enters the grooves 16 formed in the oxide layer 17 to make direct contact with the lower gate metallization 37. The gate metallization is thus not confined to the thin region on the surface of the epitaxial layer 12 which normally limits the gate metallizations 17 to a narrow filament between source and drain. Instead, the side walls of the grooves 16 and the top surface of the $SiO_x$ layer 17 are available for carrying the gate conductor. Thus, the conductor can be made as heavy as desired.

In addition, the overlying gate conductor tends to shorten the current paths and to equalize them at a smaller value. The difference in length of the current carrying conductive paths between the two mutually most remote points on the gate electrode is reduced (in the unslotted configuration) to approximately the straight line distance between the two points. Since the conductive path rides over the grooves, the grooves, which are small, will normally increase this distance by a few per cent on the average but generally not more than a fifth. The grooves are generally less than 3 to 5 microns in depth and the average widths of the digital elements are typically in excess of 50 microns. In the slotted configuration, which is used primarily for higher frequency applications, the difference in path length is also substantially shorter than that of a serially excited channel. In principal, the internal difference in path length will not substantially exceed $\sqrt{2}$ times the straight line distance between any two points of the channel and in practice, this internal difference will be less than twice the straight line distance. If the excitation is balanced and the metallizations proportionally tapered, however, the effects of these gross differences in position upon IR losses disappears altogether. In general, the electrical current carrying capacity of these paths can either be tailored to provide uniform input-output current distribution throughout the active region or simply made oversized to the point where the IR drop is negligible.

This now leads to a consideration of the distribution of the power within a single digital element. It is particularly desirable in a channel of the meandering type that the current be uniformly distributed along the perimeter of each interdigital element. At low frequencies, ohmic losses in the transmission paths provided by the present gate metallization are preferably made negligible in relation to device impedances, and even current distribution is insured by control of the intrinsic device impedances. At high frequencies, power distribution, in the present devices, is primarily influenced by the distributed reactances in the transmission path. These are made up of inductances (corresponding to path lengths) and capacitances in the actual current paths which become appreciable when the frequency increases in relation to device impedances.

Considering a single elemental "length" of channel along the perimeter of a digit, its distributed resistance becomes the "load", which should be matched to the distributed impedance of the transmission line supplying it energy. The distributed impedance of the transmission line includes both the distributed gate capacity within the active region of the semiconductors as well as the distributed capacity between the gate and source metallizations. The integrated currents in all the elemental lengths of channel bounding a given digit dictate a transmission line whose characteristic impedance is lowest at the base of that digit and which increases as one proceeds into the digit. As one proceeds into a digit, each incremental element or channel width gets an equal increment of current, and the current to the remaining elements (further into the digit) continuously decreases. This factor dictates that the opposing gate and source metallizations over the digits taper as one proceeds into the digit so as to continuously raise the characteristic impedance of the transmission line into the tip.

Thus, as illustrated in FIG. 1, the digits should be tapered and a slot may be provided in the gate metallization to provide more uniform increase in the impedance as the current proceeds to the tips of each digit.

The current distribution factor at high frequencies also dictates the general orientation of the digits with respect to the constant phase wave front. They should be in a row parallel to the constant phase wave front and point in a direction normal to the wave front. Since the opposing gate and source metallizations should taper, high frequency current distribution provides a factor dictating that the meandering channel 16 conform to a tapered configuration permitting the constant phase wave front to proceed into a digital element in a substantially straight line and exit also in a substantially straight line. Thus, if the digits are equally tapered on both sides, and the currents evenly distributed along the channel, all currents will experience approximately the same phase delay in crossing the channel, will be symmetrical between the sides and once across the channel and past the base of the digit in the drain, they will again be in an essentially straight constant phase wave front as illustrated in FIG. 2. While the high frequency power distribution cannot be completely uniform along the channel, one can provide a fairly uniform transmission of power along the major lateral surfaces of the digits, the major departure from uniformity occurring at the tips of the digit.

The invention permits considerable design flexibility with respect to the power and frequency limits of FET devices, Devices having a narrow channel width may operate at several milliwatts at typical upper frequencies of several thousand megaherz. More complex devices having a larger number of digits of several hundred milliwatts to several watts may be operated as high as 5Ghz. These types of devices operate readily at lower frequencies down to d.c., being optimized for selected portions on the spectrum.

For ease in illustration, the drawings have been generally distorted with considerable vertical scale expansion as well as lateral scale distortion. At a frequency of 5 gigaherz, a digital construction illustrated in FIG. 1, may employ source and drain metallizations which are spaced 0.3 thousandths of an inch (7.5 microns) in the channel region, with the channel metallization being centered and 2.5 microns in width. The length of a digit may be 0.009 inch with the thick base of each digit being 0.0045 inch narrowing to a tip of 0.003 inch (measured to the channel centers). The matching slot in the gate metallization may be 0.0005 in thickness and 0.008 in length. Generally, the primary objective has been to get as much channel into a unit of area as is consistent with the resolution capabilities of existing precision deposition techniques and thermal dissipation limits.

In the vertical plane, the substrate may be a chip of 5 to 10 mils thick silicon, with the epitaxial layer being 0.5 microns thick. The layers are shown in detail in FIG. 3F. They include the source and drain metallizations 13, 14, which are a composite of 200 A. of titanium with 10,000 A. of aluminum superimposed. The coatings over the substrate at the sides of the mesa include a quadruplet of thermal $SiO_2$ (33), $SiO_2$ (34), $Si_3N_4$ (35), $SiO_2$ (36), each of approximately 1,000A. The upper $SiO_2$ layer 17 is much thicker, being 3 to 5 microns. The fine gate metallization 37 is 3,000A. with the upper gate metallization 38 being about 10,000A. also.

The devices may be made in the manner illustrated in FIGS. 3A through 3F. The steps are performed in accordance with well known techniques. A high resistivity substrate which is suitable for growth of the desired epitaxial layer is selected. This may be a 10 mil thick wafer, later dissected into individual chips. The wafer is of high resistivity (>2,000 ohm centimeter) silicon, which may be either P or N type. The resistivity of the substrate must be sufficiently high so as to avoid loading the active device formed thereon. The material may be of other semiconductor materials, GaAs being particularly desirable for its high resistivity and the high majority carrier mobility of the corresponding epitaxial layer. Spinels are also applicable. An epitaxial layer 12 of N type silicon is formed to a thickness of 0.5 microns upon the silicon substrate. This should have a resistivity of 0.2 to 0.4 ohm centimeters. The channel region is formed in the epitaxial layer. Next, the exposed epitaxial layer is thermally oxidized to form a thin 1,000 A. $SiO_2$ layer as shown at 31.

Figure 3A:
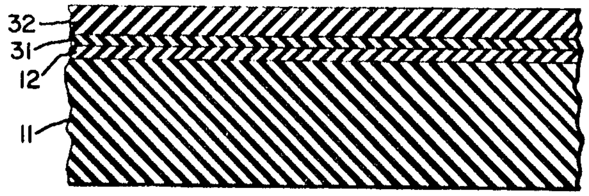
FIGS. 3A through 3F are cross section drawings illustrating the various steps in the formation of a field effect transistor embodying the invention.
Figure 3B:
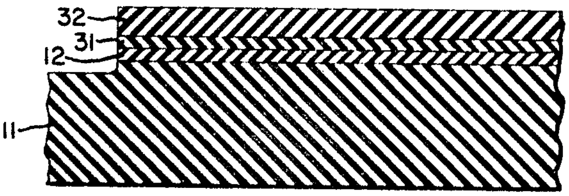

Then, as seen in FIG. 3B a layer of molybdenum 32 is deposited upon the oxide layer 31 in preparation for delineating the active epitaxial region. It is then patterned by photoresist, and the boundaries are etched to a depth of 0.8 microns, thus removing all low resistivity silicon at the boundaries and getting down into the high resistivity substrate. Sputter etching is employed to remove epitaxial material and some substrate material to form a mesa upon which the device is fabricated. The mesa is formed to electrically isolate the source and drain. Sputter etching is conducted in an argon atmosphere at 20 microns pressure. Other inert gases are suitable. Argon ions are energized to 200 to 300 electron volts and remove unmasked silicon by transferring sufficient momentum to dislodge silicon atoms from the lattice. Sputter etching is employed rather than chemical etching due to the nonreproducibility and unreliability in achieving depths accurate to 0.1 micron with chemicals.

In delineating the mesa, the use of sputter etching permits one to controllably etch below the epitaxial layer with certainty. Compared to chemical etch to insure isolation, one may need to etch twice as far. The advantages of using a step on and off the mesa of minimum height is that it simplifies the problem of insuring continuity of metallization and when subsequent photolithographic steps are undertaken, it reduces optical fringing effects. The substrate now appears as shown in FIG. 3B. Then the molybdenum layer 32 and $SiO_2$ layer 31 are removed, and the delineated edges of the epitaxial layer are oxidized for passivation as shown at 33, as well as the surface of the mesa and substrate.

Figure 3C:
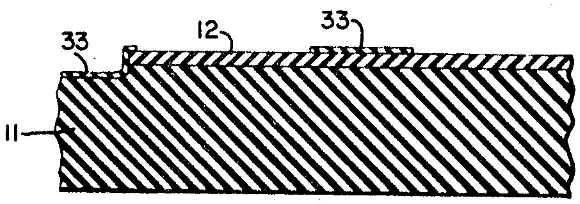
Figure 3D:
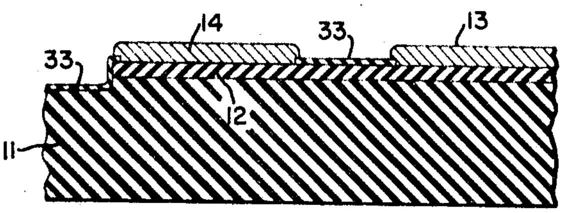
Figure 3E:
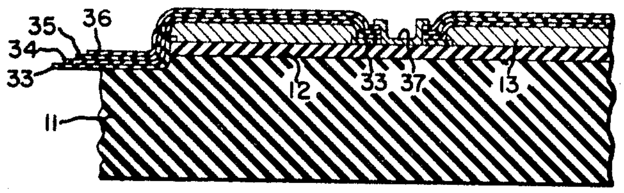
Figure 3F:
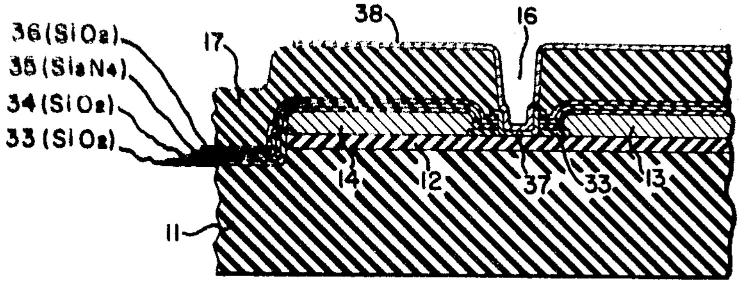

At this point, the formation of the source and drains in the delineated epitaxial layer is undertaken. The first step is the patterned removal of the $SiO_2$ 33, as shown in FIG. 3C, to expose the epitaxial layer for the source and drain metallizations. This etching step leaves a narrow strip of $SiO_2$ over the active channel region. The exposed regions for the source and drain are subjected to a brief flush of $POCl_3$. The source and drain electrodes 13, 14 are then formed upon the epitaxial layer to form conventional ohmic contacts with a thin 200A. titanium layer followed by an aluminum layer of 10,000A. The excess metal is cleaned off around the desired limits of the source and drain metallizations. The contacts may then be built up with gold or silver electrodeposition, leaving the structure as shown in FIG. 3D, ready for the formation of the gate metallization.

Preliminary to the formation of the gate metallization, 1,000A. each of $SiO_2$ (34), $Si_3N_4$ (35), $SiO_2$ (36), respectively, are deposited over the entire wafer by radio frequency sputtering. The first layer 34 is to relieve the thermal stresses between the source-drain metals and the thick $SiO_x$. Without an intermediate material such as sputtered $SiO_2$ (34), which is denser than the $SiO_x$ deposited at low temperatures from silane decomposition, the $SiO_x$ develops cracks and crazing rendering it unsuitable for accurate etch definition or for low loss electromagnetic wave propogation. Crazing is eliminated by either one layer of sputtered $SiO_2$ (34) alone or by the combination with the additional layers of $Si_3N_4$ (35) and $SiO_2$ (36). The $Si_3N_4$ (35) is used to prevent electrical shorting from the gate to source or drain in the event of over-etching the $SiO_x$ layer and deposition of the gate metallization.

At this point a pattern is formed for the gate metallization and the gate region is etched down to the epitaxial layer in the source and drain electrodes 13 and 14. This separation is typically about 7.5 microns but may be less for higher frequencies and the gate opening in the sundry layers is about 2.5 microns, allowing a lateral separation of about 2.5 microns on either side of the gate. This etching step requires considerable precision. Thereupon molybdenum or aluminum is evaporated over the substrate to a depth of 2,000A. where it forms the initial metallization 37 for the gate barrier junction. The excess molybdenum (37) is in turn removed by a pattern etch of high resolution (2 microns).

Thereupon a thick silicon dioxide ($SiO_x$) layer 17 is deposited to support the gate transmission line metallization. This layer is from 2.5 to 5 microns thickness and is suitable for forming a transmission line of convenient impedance. The $SiO_x$ is etched down over the gate Schottky barrier layer and gate conductive layer 38 is formed thereon and excess etched away. Thereupon, depending upon application, source and drain conductors are cleared for external contact to further transmission elements.

Heat is generated by IR losses primarily under the gate and in the region from gate to drain. The total length may be on the order of 5 microns. The resistance per cm. of channel width for 0.4 Ω-cm. epitaxial material is 4 ohms. The gate width may be 4 to 6 cm. For 30 percent d.c. to RF conversion efficiency at 5 watts output power, 10 to 16 watts must be dissipated in the channel and removed through the substrate. The chip size may be 100 mils by 200 mils and should be bonded to a heat sink, typically by use of a low temperature melting alloy preform.

In the principal embodiment illustrated in FIG. 1, the source and drain metallizations have been shown extending out on the substrate beyond a gate metallization spaced over it for external connection. As explained in some detail, these metallizations lead into the interdigital region of the FET and provide efficient strip line transmission paths matched to the active regions in the device and suitable for external connection. The impedance of the transmission lines should be chosen consistently with the input and output impedance requirements of the device. If the device is of several watts, the characteristic impedance of the transmission line should be a few ohms. If, on the other hand, the power is a few hundred milliwatts or less, transmission line impedances of 50 ohms or higher are suitable. The configuration may thus be introduced into external transmission paths at these impedances.

For continuity in external connection, the lower metallizations to the source and drains may be mated with wiping contacts for external connection or soldered. Similarly, the upper contacts to the gate, which are also exposed, may be contacted by wiping or soldered contacts. The construction is thus suitable for a variety of conventional strip line interconnections, including various hybrid "wireless" interconnection techniques. Flip-chip, beam-lead and STD are suitable techniques.

What is claimed as new and desired to be secured by Letters Patent of the United States is:

1. A high power field effect transistor comprising:

a. a body of semiconductor material having a thin epitaxial active region, b. a metallic source electrode making ohmic contact with said active region, c. a metallic drain electrode making ohmic contact with said active region, said source and said drain metallizations having facing irregular boundaries defining a channel in said active region of predetermined length which meanders to enhance the channel width with respect to the overall dimensions of said region, d. an insulating layer overlaying said source and drain metallizations having a meandering groove along said channel penetrating to said active region, and e. metallic conductive means, including a first portion for external connection, coating said insulating layer and the side walls of said meandering groove and overlaying portions of said source and drain metallization, and including a second portion contacting said channel in spaced relationship between the boundaries of said source and drain electrodes to form a meandering Schottky barrier gate electrode, said first gate portion reducing differences in electrical path length to points along said gate electrode to less than twice the distance between any two points, and the height of said insulating layer being adequate to reduce capacitive coupling between said conductive means and said source and drain metallizations to increase the impedance between them to permit efficient high frequency coupling into said gate region.

2. A field effect transistor as in claim 1 wherein said source electrode and said first conductive portion have planar metallizations extending from said active region, which are spaced to form an input transmission line matching the input impedance of said field effect transistor.

3. A field effect transistor as in claim 1 wherein said drain electrode and said first conductive portion have planar metallizations extending from said active region, which are spaced to form an output transmission line matching the output impedance of said field effect transistor.

4. A field effect transistor as in claim 1 wherein a. said source electrode and said first conductive portion have planar metallizations extending from said active region, which are spaced to form an input transmission line, and b. said drain electrode and said first conductive portion have planar metallizations extending from said active region, which are spaced to form an output transmission line matching the input and output impedance respectively of said field effect transistor.

5. A field effect transistor as in claim 2 wherein said input transmission line provides a signal path having a generally straight constant phase wave front orthogonal to said signal path, and wherein said irregular boundaries form a row of similarly shaped interpenetrating digital elements, said elements being pointed approximately normal to said wave front and having their bases aligned approximately parallel to said wave front for maintaining each digit at substantially the same phase.

6. A field effect transistor as in claim 3 wherein said output transmission line provides a signal path having a generally straight constant phase wave front orthogonal to said signal path, and wherein said irregular boundaries form a row of similarly shaped interpenetrating digital elements, said elements being pointed approximately normal to said wave front and having their bases aligned approximately parallel to said wave front for maintaining the output from each digit at substantially the same phase.

7. A field effect transistor as in claim 5 wherein the planar metallizations of said source electrode and of the first conductive portion within each input digit, together with the distributed intrinsic gate to source capacity, form a transmission line matched to the electrical input impedance of the channel formed along the perimeter of each input digit.

8. A field effect transistor as in claim 7 wherein said input digital elements are tapered, with said metallizations for each input digit also being tapered to produce, together with the intrinsic gate to source capacity, a transmission line associated with each digit whose characteristic impedance progressively increases as one proceeds into the digit to equalize the input current distribution about the perimeter of each input digit.

9. A field effect transistor as in claim 6 wherein the planar metallizations of said drain electrode and of first conductive portion within each output digit, together with the distributed intrinsic gate to drain capacity, form a transmission line matched to the electrical output impedance of each output digit.

10. A field effect transistor as in claim 9 wherein said output digital elements are tapered, with said metallizations for each output digit also being tapered, to produce, together with the intrinsic gate to drain capacity, a transmission line associated with each digit whose characteristic impedance progressively decreases as one proceeds out of the digit to equalize the output loading about the perimeter of each output digit.

11. A high power field effect transistor comprising:

a. a body of semiconductor material having a thin epitaxial active region, b. a metallic source electrode making ohmic contact with said active region, c. a metallic drain electrode making ohmic contact with said region, said source and said drain metallizations having facing boundaries defining a channel in said active region of predetermined length, d. an insulating layer overlaying said source and drain metallizations and having a groove along said channel penetrating to said active region, e. metallic conductive means, including a first portion for external connection, coating said insulating layer and the side walls of said groove and overlaying portions of said source and drain metallizations, and including a second portion contacting said channel in spaced relationship with the boundaries of said source and drain electrodes to form a Schottky barrier gate electrode, and the height of said insulating layer being adequate to reduce capacitive coupling between said conductive means and said source and drain metallizations to increase the impedance between them to permit efficient high frequency signals coupling into said path region.

12. A field effect transistor as in claim 11 wherein said source electrode and said first conductive portion have planar metallizations extending from said active region, which are spaced to form an input transmission line matching the input impedance of said field effect transistor.

13. A field effect transistor as in claim 11 wherein said drain electrode and said first conductive portion have planar metallizations extending from said active region, which are spaced to form an output transmission line matching the output impedance of said field effect transistor.

14. A field effect transistor as in claim 11 wherein said insulating layer is formed of $SiO_x$ deposited from silane decomposition.

15. A field effect transistor as in claim 14 wherein said insulating layer is provided with an intervening thin layer of $SiO_2$ applied by sputtering to relieve thermal stresses between the source and drain metallizations and insulating layer.

16. A field effect transistor as in claim 11 wherein said active region is an epitaxial layer formed upon a high resistivity semiconductor body member.

17. A field effect transistor as in claim 16 wherein the boundaries of said active epitaxial region are delineated by sputter etching to achieve a minimum height mesa consistent with electrical isolation.

* * * * *